United States Patent
Zhang et al.

(10) Patent No.: US 9,287,386 B2
(45) Date of Patent: Mar. 15, 2016

(54) METHOD FOR FABRICATING VERTICALLY STACKED NANOWIRES FOR SEMICONDUCTOR APPLICATIONS

(71) Applicant: Applied Materials, Inc., Santa Clara, CA (US)

(72) Inventors: Ying Zhang, Santa Clara, CA (US); Hua Chung, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/320,559

(22) Filed: Jun. 30, 2014

(65) Prior Publication Data

US 2015/0372118 A1    Dec. 24, 2015

Related U.S. Application Data

(60) Provisional application No. 62/014,643, filed on Jun. 19, 2014.

(51) Int. Cl.

| | | |
|---|---|---|
| *H01L 21/00* | (2006.01) | |
| *H01L 29/00* | (2006.01) | |
| *H01L 29/66* | (2006.01) | |
| *H01L 21/3065* | (2006.01) | |
| *H01L 29/06* | (2006.01) | |
| *H01L 29/161* | (2006.01) | |
| *H01L 29/16* | (2006.01) | |
| *H01L 21/02* | (2006.01) | |

(52) U.S. Cl.
CPC .... *H01L 29/66795* (2013.01); *H01L 21/02603* (2013.01); *H01L 21/3065* (2013.01); *H01L 29/0673* (2013.01); *H01L 29/16* (2013.01); *H01L 29/161* (2013.01); *H01L 21/02606* (2013.01)

(58) Field of Classification Search
CPC ............... H01L 29/66795; H01L 29/0673; H01L 29/161; H01L 29/16; H01L 21/3065; H01L 21/308; H01L 21/02603; H01L 21/02606
See application file for complete search history.

(56) References Cited

U.S. PATENT DOCUMENTS

| | | |
|---|---|---|
| 5,626,775 A | 5/1997 | Roberts et al. |
| 6,232,184 B1 * | 5/2001 | Wang et al. ............... 438/265 |
| 6,235,643 B1 | 5/2001 | Mui et al. |
| 6,617,244 B2 | 9/2003 | Nishizawa |

(Continued)

OTHER PUBLICATIONS

Matsuo et al, "Role of N2 Addition on CF4/O2 Remote Plasma Chemical Dry Etching of Polycrystalline Silicon", J. Vac. Sci, Tech A. vol. 15, No. 4, Jul./Aug. 1997. p. 1801.*

*Primary Examiner* — Victor A Mandala
*Assistant Examiner* — Quovaunda V Jefferson
(74) *Attorney, Agent, or Firm* — Patterson & Sheridan, LLP

(57) ABSTRACT

Embodiments of the present disclosure provide methods for forming nanowire structures with desired materials for three dimensional (3D) stacking of fin field effect transistor (Fin-FET) for semiconductor chips. In one embodiment, a method of forming nanowire structures on a substrate includes forming a multi-material layer on a substrate, wherein the multi-material layer includes repeating pairs of a first layer and a second layer, the substrate further comprising a patterned hardmask layer disposed on the multi-material layer, etching the multi-material layer through openings defined by the patterned hardmask layer to expose sidewalls of the first and the second layer of the multi-material layer, and laterally and selectively etching the second layer from the substrate.

20 Claims, 10 Drawing Sheets

(56) References Cited

U.S. PATENT DOCUMENTS

| | | |
|---|---|---|
| 6,753,264 B2 | 6/2004 | Li et al. |
| 7,683,447 B2 | 3/2010 | Wang et al. |
| 7,691,749 B2 | 4/2010 | Levy et al. |
| 7,767,977 B1 | 8/2010 | Godet et al. |
| 7,888,653 B2 | 2/2011 | Kellerman et al. |
| 8,101,510 B2 | 1/2012 | Godet et al. |
| 2003/0228532 A1 | 12/2003 | Mui et al. |
| 2004/0072440 A1 | 4/2004 | Kim et al. |
| 2004/0203177 A1 | 10/2004 | Davis et al. |
| 2005/0026431 A1 | 2/2005 | Kazumi et al. |
| 2005/0064719 A1 | 3/2005 | Liu et al. |
| 2006/0068592 A1* | 3/2006 | Dostalik ................. 438/706 |
| 2008/0113516 A1 | 5/2008 | Takeshita et al. |
| 2008/0145998 A1 | 6/2008 | Delgadino et al. |
| 2009/0085173 A1 | 4/2009 | Boemmels et al. |
| 2009/0104782 A1 | 4/2009 | Lu et al. |
| 2010/0018460 A1 | 1/2010 | Singh et al. |
| 2010/0200993 A1 | 8/2010 | Cui et al. |
| 2010/0207208 A1* | 8/2010 | Bedell et al. ............ 257/346 |
| 2012/0135273 A1 | 5/2012 | Horng et al. |
| 2012/0135543 A1 | 5/2012 | Shin et al. |
| 2013/0034968 A1 | 2/2013 | Zhang et al. |
| 2014/0038311 A1 | 2/2014 | Kim et al. |

\* cited by examiner

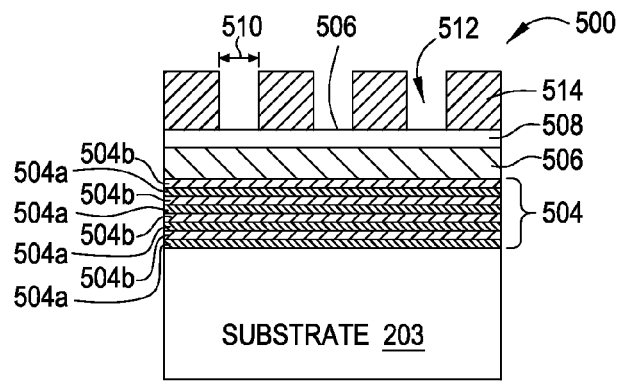
FIG. 5A
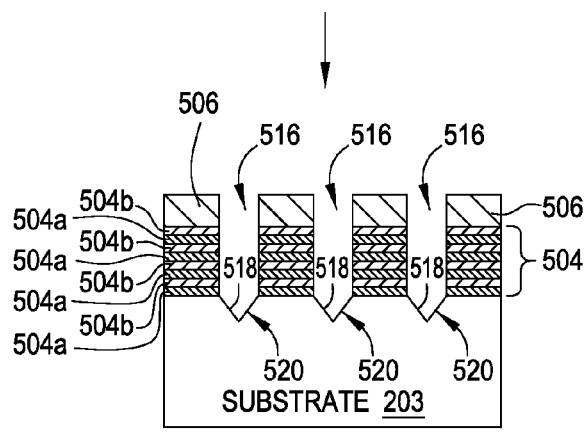
FIG. 5B
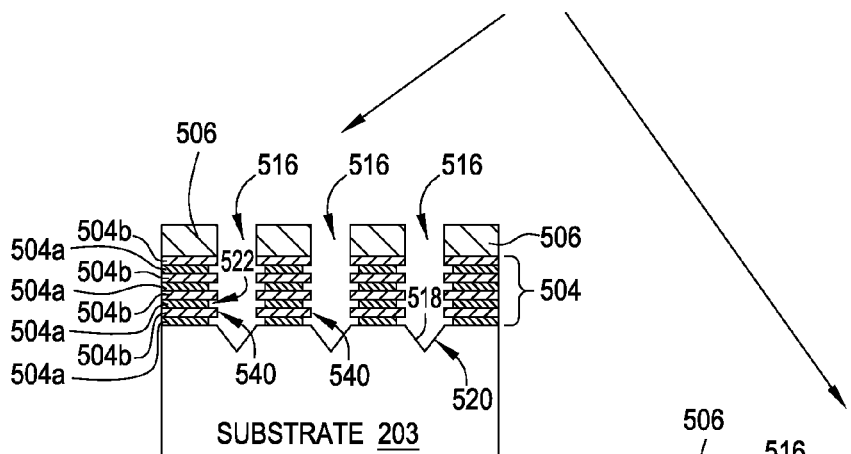
FIG. 5C1
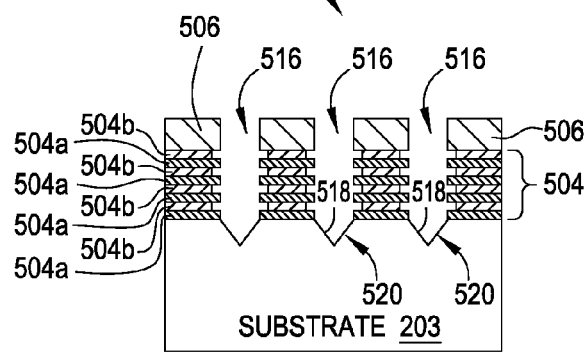
FIG. 5C2

US 9,287,386 B2

METHOD FOR FABRICATING VERTICALLY STACKED NANOWIRES FOR SEMICONDUCTOR APPLICATIONS

CROSS-REFERENCE TO RELATED APPLICATIONS

This Application claims the benefit of U.S. Provisional Application 62/014,643 filed on Jun. 19, 2014.

BACKGROUND

1. Field

Embodiments of the present invention generally relate to methods for forming vertically stacked nanowires with desired materials on a semiconductor substrate, and more particularly to methods for forming vertically stacked nanowires on a semiconductor substrate with desired materials for fin field effect transistor (FinFET) semiconductor manufacturing applications.

2. Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI technology have placed additional demands on processing capabilities. Reliable formation of gate structures on the substrate is important to VLSI and ULSI success and to the continued effort to increase circuit density and quality of individual substrates and die.

As circuit densities increase for next generation devices, the widths of interconnects, such as vias, trenches, contacts, gate structures and other features, as well as the dielectric materials therebetween, decrease to 45 nm and 32 nm dimensions, whereas the thickness of the dielectric layers remain substantially constant, with the result of increasing the aspect ratios of the features. In order to enable fabrication of next generation devices and structures, three dimensional (3D) stacking of semiconductor chips is often utilized to improve performance of the transistors. In particular, fin field effect transistors (FinFET) are often utilized to form three dimensional (3D) stacking of semiconductor chips. By arranging transistors in three dimensions instead of conventional two dimensions, multiple transistors may be placed in the integrated circuits (ICs) very close to each other. Recently, complementary metal oxide semiconductor (CMOS) FinFET devices have been widely used in many logic and other applications and are integrated into various different types of semiconductor devices. FinFET devices typically include semiconductor fins with high aspect ratios in which the channel and source/drain regions for the transistor are formed thereover. A gate electrode is then formed over and along side of a portion of the fin devices utilizing the advantage of the increased surface area of the channel and source/drain regions to produce faster, more reliable and better-controlled semiconductor transistor devices. Further advantages of FinFETs include reducing the short channel effect and providing higher current flow.

In manufacturing three dimensional (3D) stacked of semiconductor chips, multiple layers with different materials may be utilized to form nanowire structures to allow multiple interconnection structures to be disposed thereon, forming high-density of vertical transistor devices. However, using different materials to form the nanowire structures undesirably increases the manufacturing difficulty in integrating all these materials in the nanowire structures. Oftentimes, multiple complicated process sequences are required to complete the manufacturing processes for nanowire structures having more than one material, which may adversely cause high manufacturing costs, cycle times, and extra processing time. Furthermore, in the situations where different processing chambers are required to form each different film layers of the nanowire structures, transfer of the substrate in between different processing tools is always time consuming and sometime increases the likelihood of substrate contaminant when breaking vacuum between processing tools.

Thus, there is a need for improved methods for forming nanowire structures including the semiconductor fin structure with different materials on a substrate with good profile and dimension control for three dimensional (3D) stacking of semiconductor chips or other semiconductor devices.

SUMMARY

The present disclosure provide methods for forming nanowire structures with desired materials for three dimensional (3D) stacking of fin field effect transistor (FinFET) for semiconductor chips. In one example, a method of forming nanowire structures on a substrate includes forming a multi-material layer on a substrate, wherein the multi-material layer includes repeating pairs of a first layer and a second layer formed on the substrate, the substrate further comprising a patterned hardmask layer disposed on the multi-material layer, etching the multi-material layer through openings defined by the patterned hardmask layer to expose sidewalls of the first and the second layer of the multi-material layer, and laterally and selectively etching the second layer from the substrate.

In another example, a method of forming nanowire structures on a substrate includes etching a substrate having a multi-material layer disposed thereon in a first processing chamber, wherein the multi-material layer includes repeating pairs of a first layer and a second layer formed on the substrate, and wherein a portion of the multi-material layer is exposed by openings defined by a patterned hardmask layer for etching until sidewalls of the first and the second layer of the multi-material layer are exposed, and laterally and selectively etching the second layer from the substrate in a second processing chamber without breaking vacuum, wherein the first and the second processing chamber are incorporated in a processing system.

In yet another example, a method of forming nanowire structures on a substrate includes etching a substrate having a multi-material layer disposed thereon, wherein the multi-material layer includes repeating pairs of a first layer and a second layer formed on the substrate, and wherein a portion of the multi-material layer is exposed by openings defined by a patterned hardmask layer for etching until sidewalls of the first and the second layer of the multi-material layer are exposed, and laterally and selectively etching the second layer from the substrate by a remotely generated plasma including a hydrocarbon containing gas and at least one of $N_2$, $O_2$, or $H_2$ gas.

DETAILED DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 depicts an etching processing chamber which may be utilized to perform an etching process on a substrate;

Figure 2:
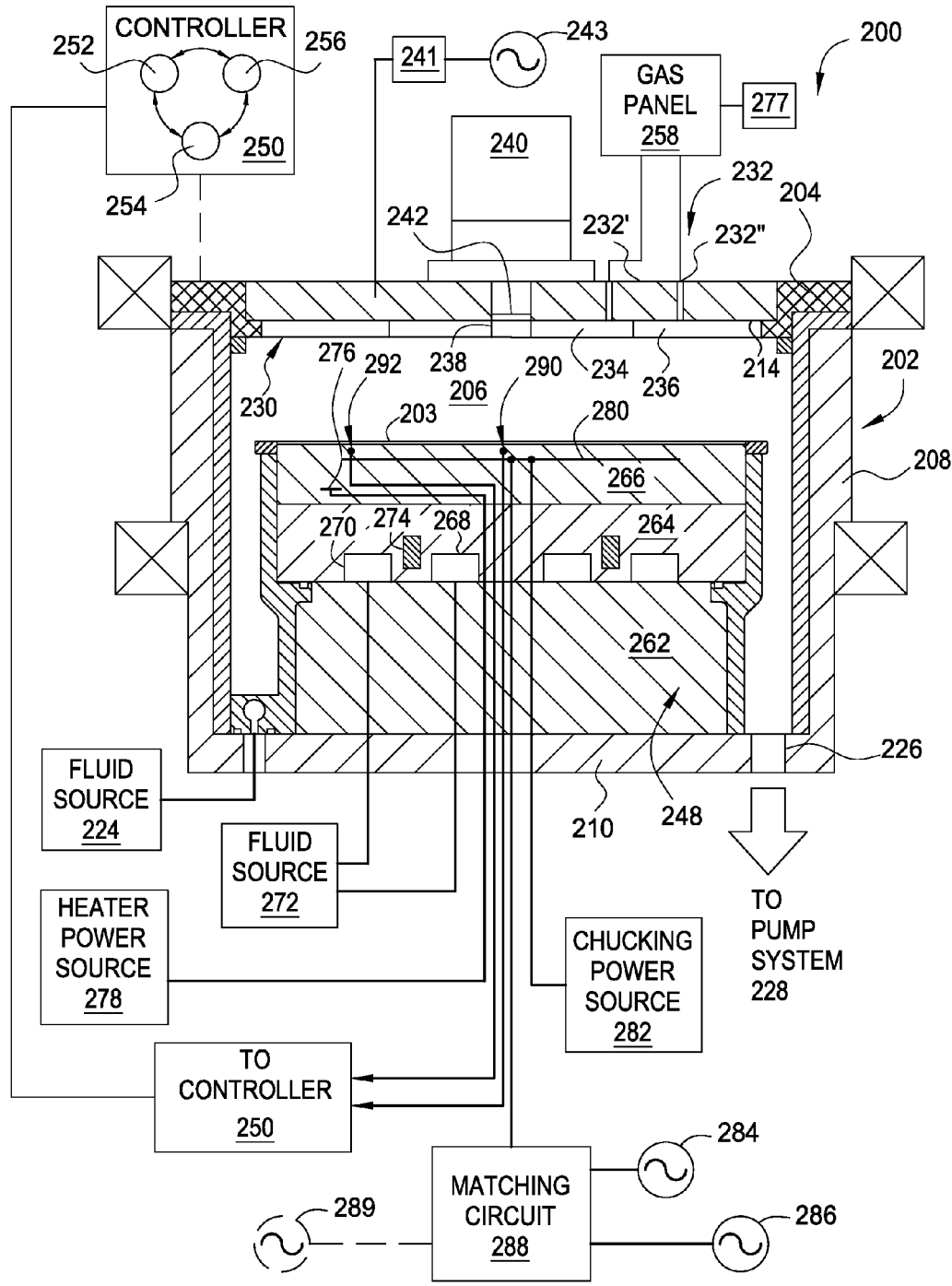
FIG. 2 depicts another example of an etching processing chamber which may be utilized to perform an etching process on a substrate.
Figure 4:
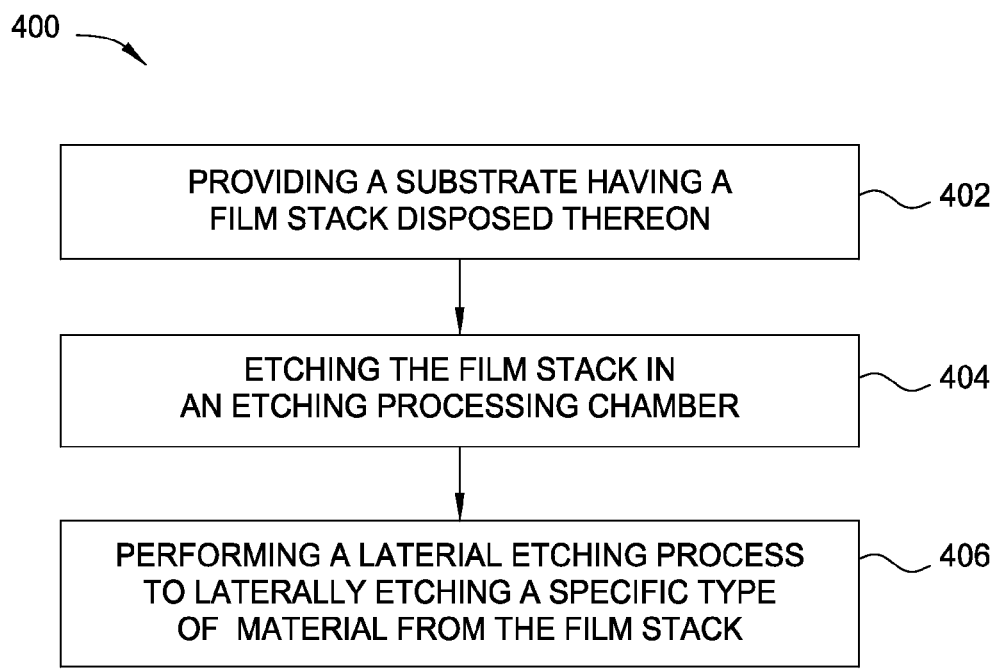
FIG. 4 depicts a flow diagram of a method for forming nanowire structures with composite materials formed on a substrate.
Figure 5A:
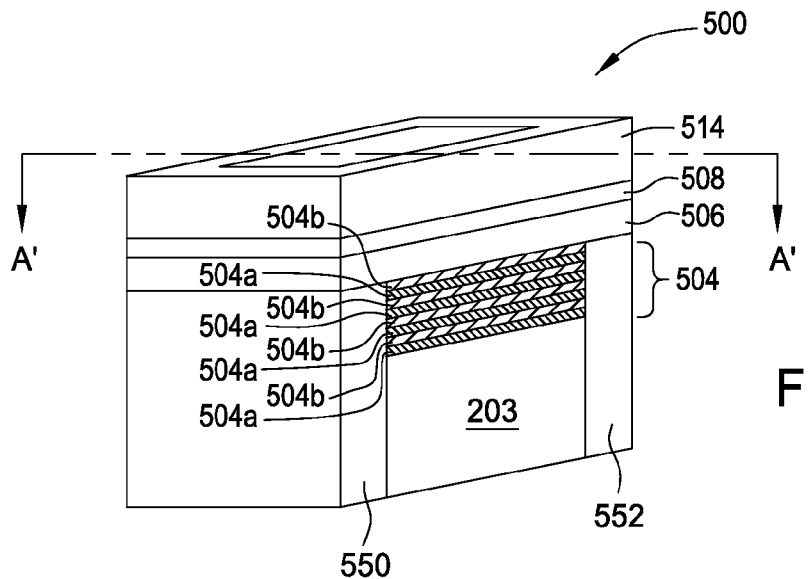
Figure 5B:
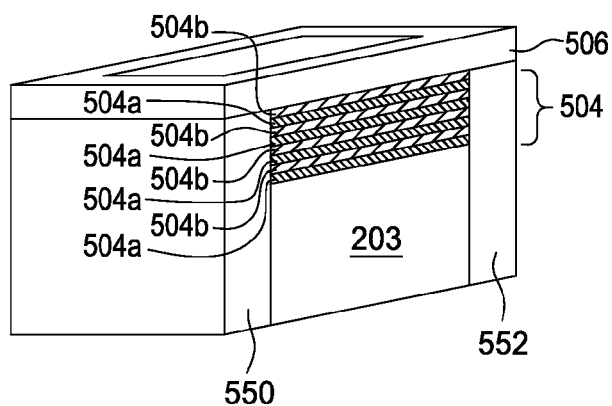
Figure 5C:
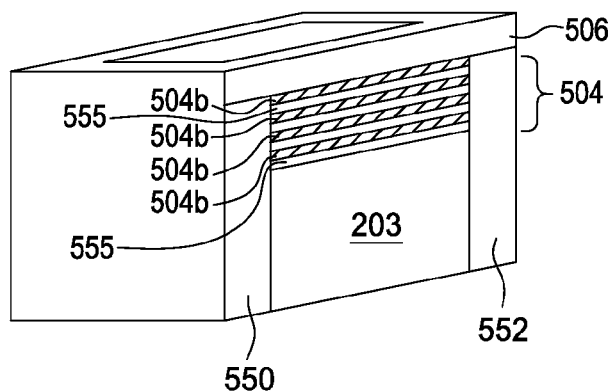
Figure 6:
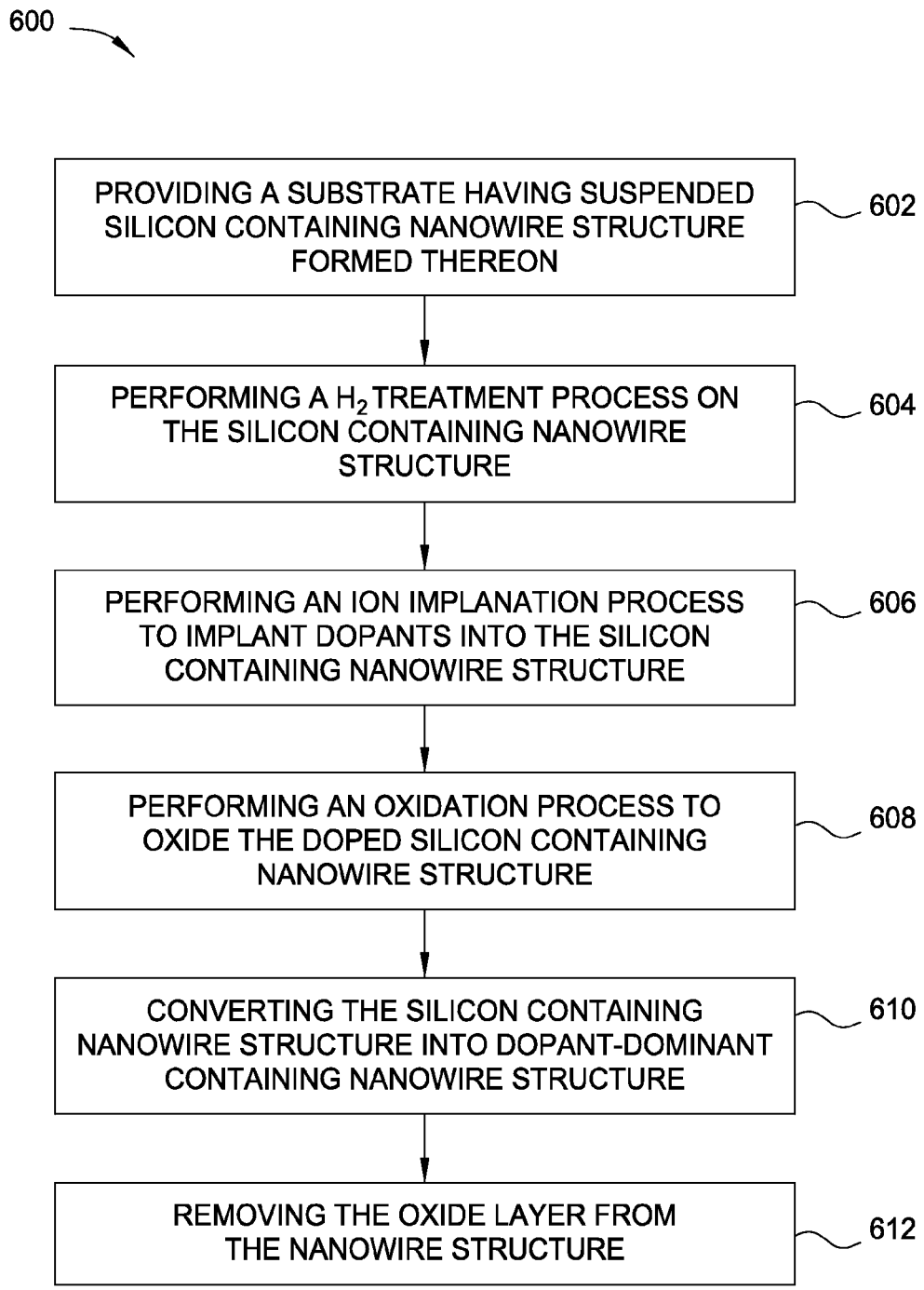
Figure 8:
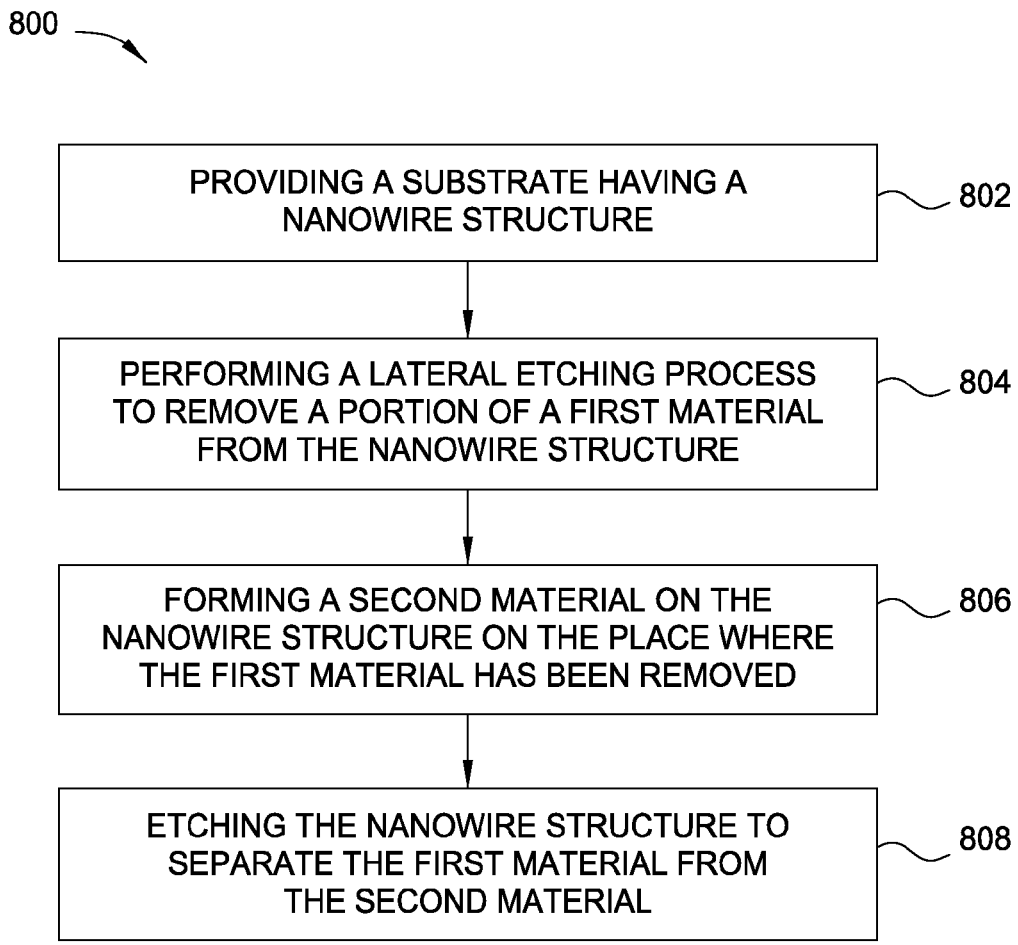

FIG. 5A-5C2 depict one example of cross sectional views of a sequence for forming a nanowire structure with desired materials during the manufacturing process of FIG. 4;

FIG. 5A', 5B' and 5C' depict top schematic views of a sequence for forming a nanowire structure with desired materials during the manufacturing process of FIG. 4;

FIG. 6 depicts a flow diagram of another example of a method for forming nanowire structures with a desired material using a converting process formed on a substrate;

FIG. 7A-7E depict top schematic views of a sequence for forming a nanowire structure with a desired material using a converting process during the manufacturing process of FIG. 6;

FIG. 8 depicts a flow diagram of yet another example of a method for forming nanowire structures with more than one materials formed on a substrate; and FIG. 9A-9D depict top schematic views of a sequence for forming a nanowire structure with a more than one materials during the manufacturing process of FIG. 8.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Methods for manufacturing nanowire structures with desired materials formed therein for three dimensional (3D) stacking of fin field effect transistor (FinFET) semiconductor structures is provided. In one example, the nanowire structures may be formed by depositing multiple layers to form a film stack on a substrate. A lateral etching process may be utilized to selectively remove a selected type of material from the film stack to form the nanowire structure with suspended nanowires. In another example, a conversion process may be performed to convert the material from the film stack to a different material as needed. In yet another example, a selective deposition process may also be utilized to form the nanowire structure with composite materials.

Figure 1:
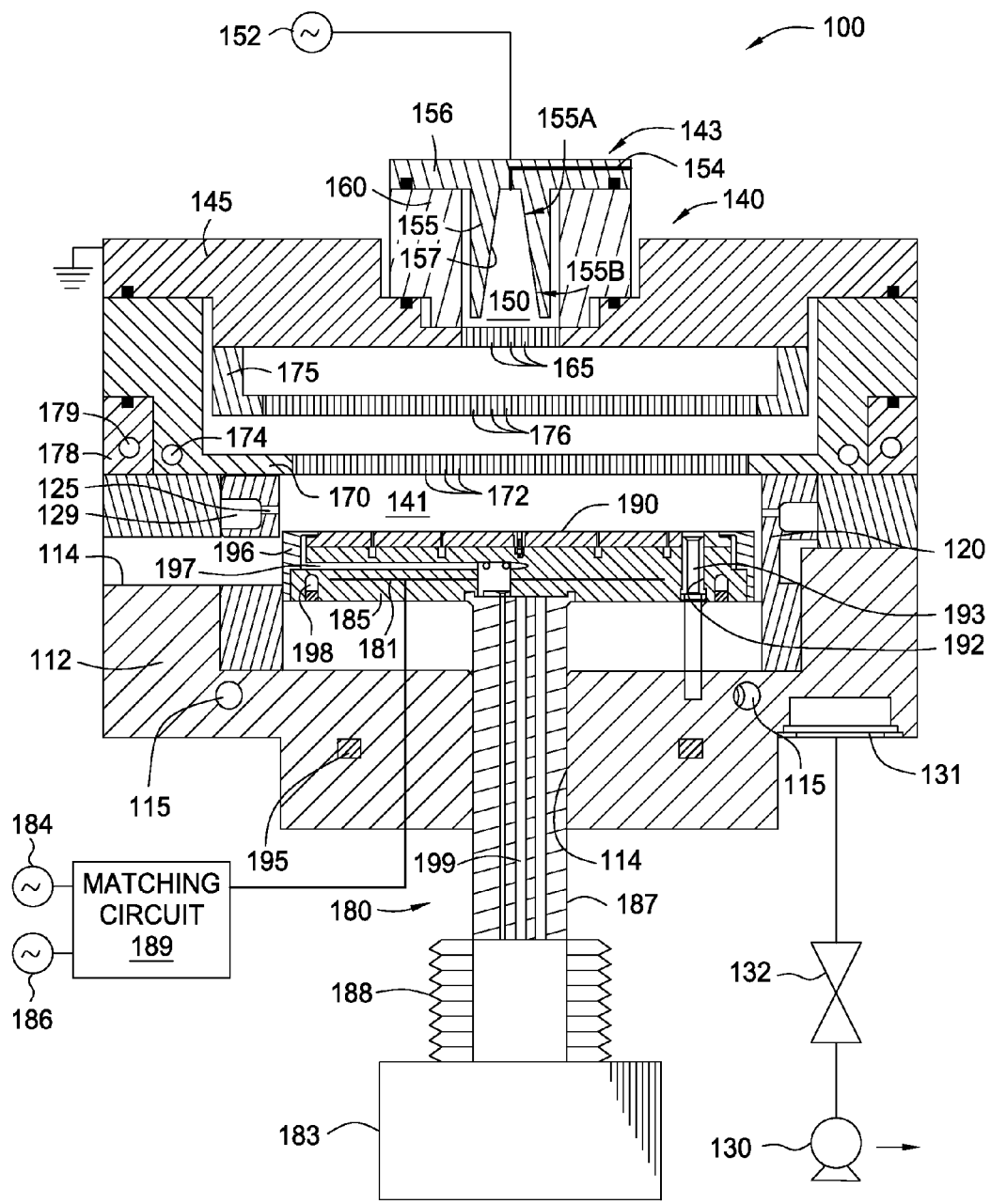

FIG. 1 is a cross sectional view of an illustrative processing chamber 100 suitable for conducting an etching process as further described below. The chamber 100 may be configured to remove materials from a material layer disposed on a substrate surface. The chamber 100 is particularly useful for performing the plasma assisted dry etch process. The processing chamber 100 may be a Siconi™, Capa™, or Frontier™ chamber, which is available from Applied Materials, Santa Clara, Calif. It is noted that other vacuum processing chambers available from other manufactures may also be adapted to practice the present invention.

The processing chamber 100 includes a chamber body 112, a lid assembly 140, and a support assembly 180. The lid assembly 140 is disposed at an upper end of the chamber body 112, and the support assembly 180 is at least partially disposed within the chamber body 112.

The chamber body 112 includes a slit valve opening 114 formed in a sidewall thereof to provide access to the interior of the processing chamber 100. The slit valve opening 114 is selectively opened and closed to allow access to the interior of the chamber body 112 by a wafer handling robot (not shown).

In one or more implementations, the chamber body 112 includes a channel 115 formed therein for flowing a heat transfer fluid therethrough. The chamber body 112 can further include a liner 120 that surrounds the support assembly 180. The liner 120 is removable for servicing and cleaning. In one or more embodiments, the liner 120 includes one or more apertures 125 and a pumping channel 129 formed therein that is in fluid communication with a vacuum system. The apertures 125 provide a flow path for gases into the pumping channel 129, which provides an egress for the gases within the processing chamber 100.

The vacuum system can include a vacuum pump 130 and a throttle valve 132 to regulate flow of gases through the processing chamber 100. The vacuum pump 130 is coupled to a vacuum port 131 disposed in the chamber body 112 and therefore, in fluid communication with the pumping channel 129 formed within the liner 120. The lid assembly 140 includes at least two stacked components configured to form a plasma volume or cavity therebetween. In one or more embodiments, the lid assembly 140 includes a first electrode 143 ("upper electrode") disposed vertically above a second electrode 145 ("lower electrode") confining a plasma volume or cavity 150 therebetween. The first electrode 143 is connected to a power source 152, such as an RF power supply, and the second electrode 145 is connected to ground, forming a capacitance between the two electrodes 143,145.

In one or more implementations, the lid assembly 140 includes one or more gas inlets 154 (only one is shown) that are at least partially formed within an upper section 156 of the first electrode 143. The one or more process gases enter the lid assembly 140 via the one or more gas inlets 154. The one or more gas inlets 154 are in fluid communication with the plasma cavity 150 at a first end thereof and coupled to one or more upstream gas sources and/or other gas delivery components, such as gas mixers, at a second end thereof. In one or more embodiments, the first electrode 143 has an expanding section 155 that houses the plasma cavity 150.

In one or more implementations, the expanding section 155 is an annular member that has an inner surface or diameter 157 that gradually increases from an upper portion 155A thereof to a lower portion 155B thereof. As such, the distance between the first electrode 143 and the second electrode 145 is variable. That varying distance helps control the formation and stability of the plasma generated within the plasma cavity 150. A plasma generated in the plasma cavity 150 is defined in the lid assembly 140 prior to entering into a processing region 141 above the support assembly 180 wherein the substrate is proceed, the plasma is considered as a remote plasma source that generated remotely from the processing region 141.

The lid assembly 140 can further include an isolator ring 160 that electrically isolates the first electrode 143 from the second electrode 145. The lid assembly 140 can further include a distribution plate 170 and blocker plate 175 adjacent the second electrode 145. The second electrode 145, distribution plate 170 and blocker plate 175 can be stacked and disposed on a lid rim 178 which is connected to the chamber body 112. In one or more implementations, the second electrode or top plate 145 can include a plurality of gas passages or apertures 165 formed beneath the plasma cavity 150 to allow gas from the plasma cavity 150 to flow therethrough. The distribution plate 170 is substantially disc-shaped and also includes a plurality of apertures 172 or passageways to distribute the flow of gases therethrough. In one or more embodiments, the distribution plate 170 includes one or more embedded channels or passages 174 for housing a heater or heating fluid to provide temperature control of the lid assembly 140. The blocker plate 175 includes a plurality of apertures 176 to provide a plurality of gas passages from the second electrode 145 to the distribution plate 170. The apertures 176 can be sized and positioned about the blocker plate 175 to provide a controlled and even flow distribution of gases to the distribution plate 170.

The support assembly 180 can include a support member 185 to support a substrate (not shown in this view) for processing within the chamber body 112. The support member 185 can be coupled to a lift mechanism 183 through a shaft 187 which extends through a centrally-located opening 114 formed in a bottom surface of the chamber body 112. The lift mechanism 183 can be flexibly sealed to the chamber body 112 by a bellows 188 that prevents vacuum leakage from around the shaft 187.

In one embodiment, the electrode 181 that is coupled to a plurality of RF power bias sources 184, 186. The RF bias power sources 184, 186 are coupled between the electrode 181 disposed in the support member 185. The RF bias power excites and sustains a plasma discharge formed from the gases disposed in the processing region 141 of the chamber body.

In the embodiment depicted in FIG. 1, the dual RF bias power sources 184, 186 are coupled to the electrode 181 disposed in the support member 185 through a matching circuit 189. The signal generated by the RF bias power sources 184, 186 is delivered through matching circuit 189 to the support member 185 through a single feed to ionize the gas mixture provided in the plasma processing chamber 100, thereby providing ion energy necessary for performing a deposition or other plasma enhanced process. The RF bias power sources 184, 186 are generally capable of producing an RF signal having a frequency of from about 50 kHz to about 200 MHz and a power between about 0 Watts and about 5000 Watts. Additional bias power sources may be coupled to the electrode 181 to control the characteristics of the plasma as needed.

The support member 185 can include bores 192 formed therethrough to accommodate lift pins 193, one of which is shown in FIG. 1. Each lift pin 193 is constructed of ceramic or ceramic-containing materials, and are used for substrate-handling and transport. The lift pin 193 is moveable within its respective bore 192 when engaging an annular lift ring 195 disposed within the chamber body 112. The support assembly 180 can further include an edge ring 196 disposed about the support member 185.

The temperature of the support assembly 180 can be controlled by a fluid circulated through a fluid channel 198 embedded in the body of the support member 185. In one or more implementations, the fluid channel 198 is in fluid communication with a heat transfer conduit 199 disposed through the shaft 187 of the support assembly 180. The fluid channel 198 is positioned about the support member 185 to provide a uniform heat transfer to the substrate receiving surface of the support member 185. The fluid channel 198 and heat transfer conduit 199 can flow heat transfer fluids to either heat or cool the support member 185. Any suitable heat transfer fluid may be used, such as water, nitrogen, ethylene glycol, or mixtures thereof. The support assembly 180 can further include an embedded thermocouple (not shown) for monitoring the temperature of the support surface of the support member 185. For example, a signal from the thermocouple may be used in a feedback loop to control the temperature or flow rate of the fluid circulated through the fluid channel 198.

The support member 185 can be moved vertically within the chamber body 112 so that a distance between support member 185 and the lid assembly 140 can be controlled. A sensor (not shown) can provide information concerning the position of support member 185 within chamber 100.

A system controller (not shown) can be used to regulate the operations of the processing chamber 100. The system controller can operate under the control of a computer program stored on a memory of a computer. The computer program may include instructions that enable the preclean process described below to be performed in the processing chamber 100. For example, the computer program can dictate the process sequencing and timing, mixture of gases, chamber pressures, RF power levels, susceptor positioning, slit valve opening and closing, wafer cooling and other parameters of a particular process.

FIG. 2 is a sectional view of one example of a processing chamber 200 suitable for performing a patterning process to etch a planarization layer along with a hardmask layer on a substrate using an anisotropic etching process. Suitable processing chambers that may be adapted for use with the teachings disclosed herein include, for example, a ENABLER® or C3® processing chamber available from Applied Materials, Inc. of Santa Clara, Calif. Although the processing chamber 200 is shown including a plurality of features that enable superior etching performance, it is contemplated that other processing chambers may be adapted to benefit from one or more of the inventive features disclosed herein.

The processing chamber 200 includes a chamber body 202 and a lid 204 which enclose an interior volume 206. The chamber body 202 is typically fabricated from aluminum, stainless steel or other suitable material. The chamber body 202 generally includes sidewalls 208 and a bottom 210. A substrate support pedestal access port (not shown) is generally defined in a sidewall 208 and a selectively sealed by a slit valve to facilitate entry and egress of a substrate 100 from the processing chamber 200. An exhaust port 226 is defined in the chamber body 202 and couples the interior volume 206 to a pump system 228. The pump system 228 generally includes one or more pumps and throttle valves utilized to evacuate and regulate the pressure of the interior volume 206 of the processing chamber 200. In one implementation, the pump system 228 maintains the pressure inside the interior volume 206 at operating pressures typically between about 10 mTorr to about 500 Torr.

The lid 204 is sealingly supported on the sidewall 208 of the chamber body 202. The lid 204 may be opened to allow excess to the interior volume 106 of the processing chamber 200. The lid 204 includes a window 242 that facilitates optical process monitoring. In one implementation, the window 242 is comprised of quartz or other suitable material that is transmissive to a signal utilized by an optical monitoring system 240 mounted outside the processing chamber 200.

The optical monitoring system 240 is positioned to view at least one of the interior volume 206 of the chamber body 202 and/or the substrate 100 positioned on a substrate support pedestal assembly 248 through the window 242. In one embodiment, the optical monitoring system 240 is coupled to the lid 204 and facilitates an integrated deposition process that uses optical metrology to provide information that enables process adjustment to compensate for incoming substrate pattern feature inconsistencies (such as thickness, and the like), provide process state monitoring (such as plasma monitoring, temperature monitoring, and the like) as needed. One optical monitoring system that may be adapted to benefit from the invention is the EyeD® full-spectrum, interferometric metrology module, available from Applied Materials, Inc., of Santa Clara, Calif.

A gas panel 258 is coupled to the processing chamber 200 to provide process and/or cleaning gases to the interior volume 206. In the example depicted in FIG. 2, inlet ports 232', 232" are provided in the lid 204 to allow gases to be delivered from the gas panel 258 to the interior volume 206 of the processing chamber 200. In one implementation, the gas panel 258 is adapted to provide fluorinated process gas through the inlet ports 232', 232" and into the interior volume 206 of the processing chamber 200. In one implementation, the process gas provided from the gas panel 258 includes at least a fluorinated gas, chlorine, and a carbon containing gas, an oxygen gas, a nitrogen containing gas and a chlorine containing gas. Examples of fluorinated and carbon containing gases include $CHF_3$, $CH_2F_2$ and $CF_4$. Other fluorinated gases may include one or more of $C_2F$, $C_4F_6$, $C_3F_8$ and $C_5F_8$. Examples of the oxygen containing gas include $O_2$, $CO_2$, $CO$, $N_2O$, $NO_2$, $O_3$, $H_2O$, and the like. Examples of the nitrogen containing gas include $N_2$, $NH_3$, $N_2O$, $NO_2$ and the like. Examples of the chlorine containing gas include HCl, $Cl_2$, $CCl_4$, $CHCl_3$, $CH_2Cl_2$, $CH_3Cl$, and the like. Suitable examples of the carbon containing gas include methane ($CH_4$), ethane ($C_2H_6$), ethylene ($C_2H_4$), and the like.

A showerhead assembly 230 is coupled to an interior surface 214 of the lid 204. The showerhead assembly 230 includes a plurality of apertures that allow the gases flowing through the showerhead assembly 230 from the inlet ports 232', 232" into the interior volume 206 of the processing chamber 200 in a predefined distribution across the surface of the substrate 100 being processed in the processing chamber 200.

A remote plasma source 277 may be optionally coupled to the gas panel 258 to facilitate dissociating gas mixture from a remote plasma prior to entering into the interior volume 206 for processing. A RF source power 243 is coupled through a matching network 241 to the showerhead assembly 230. The RF source power 243 typically is capable of producing up to about 3000 W at a tunable frequency in a range from about 50 kHz to about 200 MHz.

The showerhead assembly 230 additionally includes a region transmissive to an optical metrology signal. The optically transmissive region or passage 238 is suitable for allowing the optical monitoring system 240 to view the interior volume 206 and/or the substrate 100 positioned on the substrate support pedestal assembly 248. The passage 238 may be a material, an aperture or plurality of apertures formed or disposed in the showerhead assembly 230 that is substantially transmissive to the wavelengths of energy generated by, and reflected back to, the optical monitoring system 240. In one embodiment, the passage 238 includes a window 242 to prevent gas leakage through the passage 238. The window 242 may be a sapphire plate, quartz plate or other suitable material. The window 242 may alternatively be disposed in the lid 204.

In one implementation, the showerhead assembly 230 is configured with a plurality of zones that allow for separate control of gas flowing into the interior volume 206 of the processing chamber 200. In the example illustrated in FIG. 2, the showerhead assembly 230 as an inner zone 234 and an outer zone 236 that are separately coupled to the gas panel 258 through separate inlet ports 232', 232".

The substrate support pedestal assembly 248 is disposed in the interior volume 206 of the processing chamber 200 below the gas distribution (showerhead) assembly 230. The substrate support pedestal assembly 248 holds the substrate 100 during processing. The substrate support pedestal assembly 248 generally includes a plurality of lift pins (not shown) disposed therethrough that are configured to lift the substrate 100 from the substrate support pedestal assembly 248 and facilitate exchange of the substrate 100 with a robot (not shown) in a conventional manner. An inner liner 218 may closely circumscribe the periphery of the substrate support pedestal assembly 248.

In one implementation, the substrate support pedestal assembly 248 includes a mounting plate 262, a base 264 and an electrostatic chuck 266. The mounting plate 262 is coupled to the bottom 210 of the chamber body 202 includes passages for routing utilities, such as fluids, power lines and sensor leads, among others, to the base 264 and the electrostatic chuck 166. The electrostatic chuck 266 comprises at least one clamping electrode 280 for retaining the substrate 100 below showerhead assembly 230. The electrostatic chuck 266 is driven by a chucking power source 282 to develop an electrostatic force that holds the substrate 100 to the chuck surface, as is conventionally known. Alternatively, the substrate 100 may be retained to the substrate support pedestal assembly 248 by clamping, vacuum or gravity.

At least one of the base 264 or electrostatic chuck 266 may include at least one optional embedded heater 276, at least one optional embedded isolator 274 and a plurality of conduits 268, 270 to control the lateral temperature profile of the substrate support pedestal assembly 248. The conduits 268, 270 are fluidly coupled to a fluid source 272 that circulates a temperature regulating fluid therethrough. The heater 276 is regulated by a power source 278. The conduits 268, 270 and heater 276 are utilized to control the temperature of the base 264, thereby heating and/or cooling the electrostatic chuck 266 and ultimately, the temperature profile of the substrate 100 disposed thereon. The temperature of the electrostatic chuck 266 and the base 264 may be monitored using a plurality of temperature sensors 290, 292. The electrostatic chuck 266 may further comprise a plurality of gas passages (not shown), such as grooves, that are formed in a substrate support pedestal supporting surface of the chuck 266 and fluidly coupled to a source of a heat transfer (or backside) gas, such as He. In operation, the backside gas is provided at controlled pressure into the gas passages to enhance the heat transfer between the electrostatic chuck 266 and the substrate 100.

In one implementation, the substrate support pedestal assembly 248 is configured as a cathode and includes an electrode 280 that is coupled to a plurality of RF power bias sources 284, 286. The RF bias power sources 284, 286 are coupled between the electrode 280 disposed in the substrate support pedestal assembly 248 and another electrode, such as the showerhead assembly 230 or ceiling (lid 204) of the chamber body 202. The RF bias power excites and sustains a plasma discharge formed from the gases disposed in the processing region of the chamber body 202.

In the example depicted in FIG. 2, the dual RF bias power sources 284, 286 are coupled to the electrode 280 disposed in the substrate support pedestal assembly 248 through a matching circuit 288. The signal generated by the RF bias power 284, 286 is delivered through matching circuit 188 to the substrate support pedestal assembly 248 through a single feed to ionize the gas mixture provided in the plasma processing chamber 200, thereby providing ion energy necessary for performing a deposition or other plasma enhanced process. The RF bias power sources 284, 286 are generally capable of producing an RF signal having a frequency of from about 50 kHz to about 200 MHz and a power between about 0 Watts and about 5000 Watts. An additional bias power source 289 may be coupled to the electrode 280 to control the characteristics of the plasma.

In one mode of operation, the substrate 100 is disposed on the substrate support pedestal assembly 248 in the plasma processing chamber 200. A process gas and/or gas mixture is introduced into the chamber body 202 through the showerhead assembly 230 from the gas panel 258. A vacuum pump system 228 maintains the pressure inside the chamber body 202 while removing deposition by-products.

A controller 250 is coupled to the processing chamber 200 to control operation of the processing chamber 200. The controller 250 includes a central processing unit (CPU) 252, a memory 254, and a support circuit 256 utilized to control the process sequence and regulate the gas flows from the gas panel 258. The CPU 252 may be any form of general purpose computer processor that may be used in an industrial setting. The software routines can be stored in the memory 254, such as random access memory, read only memory, floppy, or hard disk drive, or other form of digital storage. The support circuit 256 is conventionally coupled to the CPU 252 and may include cache, clock circuits, input/output systems, power supplies, and the like. Bi-directional communications between the controller 250 and the various components of the processing system 200 are handled through numerous signal cables.

Figure 3:
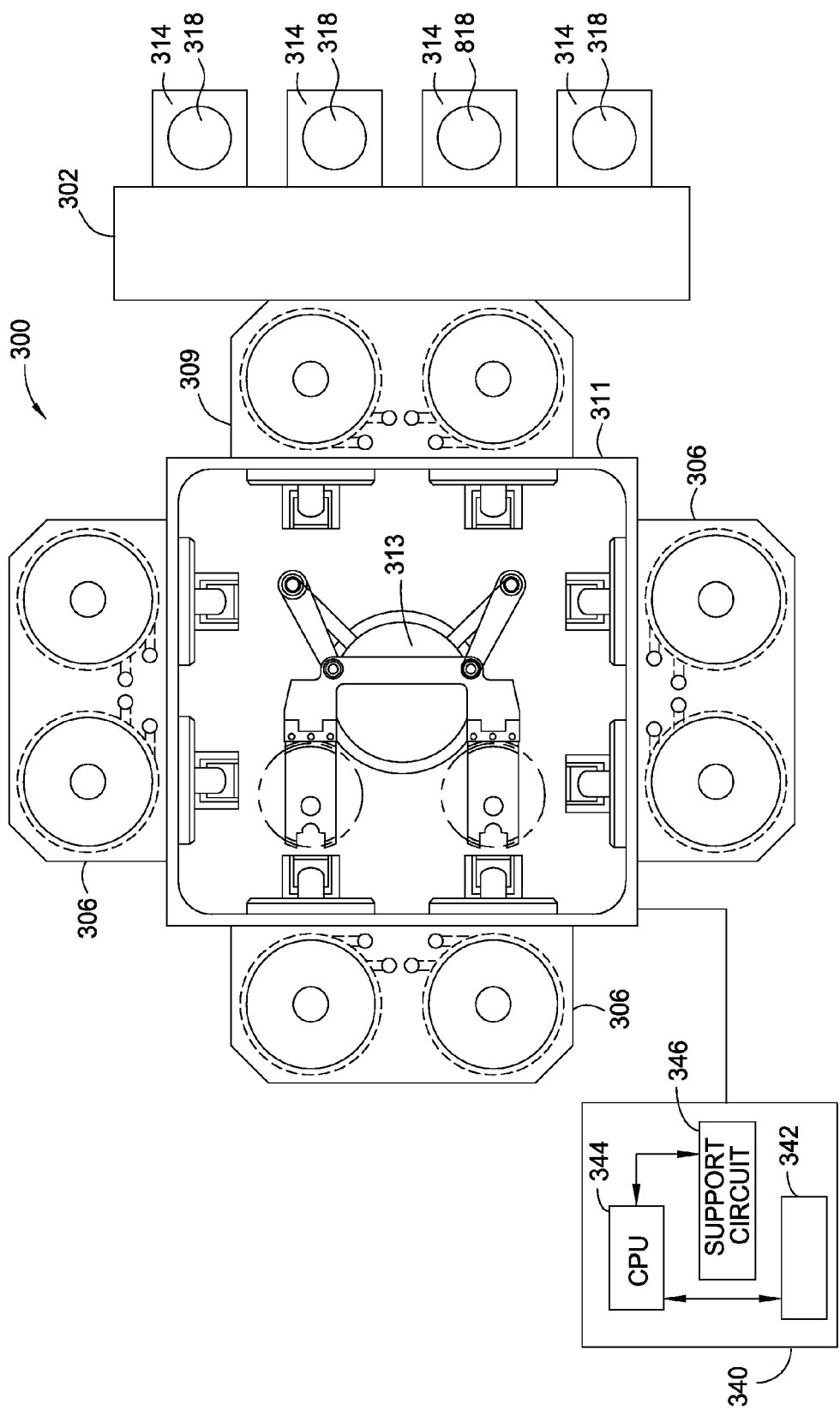
FIG. 3 depicts a processing system that may include different processing chambers of FIGS. 1 and 2 to be incorporated therein.

FIG. 3 depicts a plan view of a semiconductor processing system 300 the methods described herein may be practiced. One processing system that may be adapted to benefit from the invention is a 300 mm Producer™ processing system, commercially available from Applied Materials, Inc., of Santa Clara, Calif. The processing system 300 generally includes a front platform 302 where substrate cassettes 318 included in FOUPs 314 are supported and substrates are loaded into and unloaded from a loadlock chamber 309, a transfer chamber 311 housing a substrate handler 313 and a series of tandem processing chambers 306 mounted on the transfer chamber 311.

Each of the tandem processing chambers 306 includes two process regions for processing the substrates. The two process regions share a common supply of gases, common pressure control, and common process gas exhaust/pumping system. Modular design of the system enables rapid conversion from any one configuration to any other. The arrangement and combination of chambers may be altered for purposes of performing specific process steps. Any of the tandem processing chambers 106 can include a lid according to aspects of the invention as described below that includes one or more chamber configurations described above with referenced to the processing chambers 100, 200 depicted in FIGS. 1 and 2. It is noted that the processing chambers 306 may be configured to perform etching process, deposition processes, curing processes, or heating/annealing process as needed. In one embodiment, processing chambers 100, 200, shown as a single chamber designed, may be incorporated into the semiconductor processing system 300 and retrofitted to be in form of the tandem processing chambers 306.

In one implementation, the system 100 can be adapted with one or more of the tandem processing chambers having supporting chamber hardware known to accommodate various other known processes such as chemical vapor deposition (CVD), physical vapor deposition (PVD), etching, curing, or heating/annealing and the like. For example, the system 100 can be configured with one of the tandem processing chambers 106 as an etching chamber for etching, such as a dielectric film, on the substrates. Such a configuration can maximize research and development fabrication utilization and, if desired, eliminate exposure of films as etched to atmosphere.

A controller 340, including a central processing unit (CPU) 344, a memory 342, and support circuits 346, is coupled to the various components of the semiconductor processing system 300 to facilitate control of the processes of the present invention. The memory 342 can be any computer-readable medium, such as random access memory (RAM), read only memory (ROM), floppy disk, hard disk, or any other form of digital storage, local or remote to the semiconductor processing system 300 or CPU 344. The support circuits 346 are coupled to the CPU 344 for supporting the CPU in a conventional manner. These circuits include cache, power supplies, clock circuits, input/output circuitry and subsystems, and the like. A software routine or a series of program instructions stored in the memory 342, when executed by the CPU 344, executes the tandem processing chambers 306.

FIG. 4 is a flow diagram of one example of a method 400 for manufacturing a nanowire structure with composite materials formed therein. FIGS. 5A-5C2 are cross-sectional views of a portion of a composite substrate corresponding to various stages of the method 400. The method 400 may be utilized to form the nanowire structure for fin structures on a substrate having desired materials which may later be utilized to form a fin field effect transistor (FinFET) for three dimensional (3D) stacking of semiconductor chips. Alternatively, the method 400 may be beneficially utilized to etch other types of structures.

The method 400 begins at block 402 by providing a substrate, such as the substrate 203 depicted in FIG. 2, having a film stack 500 formed thereon, as shown in FIG. 5A. The substrate 203 may be a material such as crystalline silicon (e.g., Si<100> or Si<111>), silicon oxide, strained silicon, silicon germanium, germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. The substrate 203 may have various dimensions, such as 200 mm, 300 mm, 450 mm or other diameter, as well as, being a rectangular or square panel. Unless otherwise noted, examples described herein are conducted on substrates with a 200 mm diameter, a 300 mm diameter, or a 450 mm diameter substrate.

The film stack 500 includes a multi-material layer 504 disposed thereon. The multi-material layer 504 includes at least one a first layer 504a and a second layer 504b. Although the example depicted in FIG. 5A shows four pairs of the first layer 504a and the second layer 504b (alternating the first layer 504a and the second layer 504b repeatedly formed on the substrate 203), it is noted that number of the first layer 504a and the second layer 504b may be varied based on different process needs. In one particular embodiment, twenty pairs of first and second layers, 504a, 504b, such as about 10 pairs, may be deposited to form the multi-material layer 504 on the substrate 203. In one implementation, the thickness of each single first layer 504a may be controlled at between about 20 Å and about 200 Å, such as about 50 Å, and the thickness of the each single second layer 504b may be controlled at between about 20 Å and about 200 Å, such as about 50 Å. The multi-material layer 504 may have a total thickness between about 10 Å and about 5000 Å, such as between about 40 Å and about 4000 Å.

The first layer 504a may be a crystalline silicon layer, such as a single crystalline, polycrystalline, or monocrystalline silicon layer, formed by an epitaxial deposition process. Alternatively, the first layer 504a may be a doped silicon layer, including a p-type doped silicon layer or a n-type doped layer. Suitable p-type dopant includes B dopants, Al dopants, Ga dopants, In dopants, or the like. Suitable n-type dopant includes N dopants, P dopants, As dopants, Sb dopants, or the like. In yet another example, the first layer 504a may be a group III-V material, such as a GaAs layer.

The second layer 504b may be a Ge containing layer, such as a SiGe layer, Ge layer, or other suitable layer. Alternatively, the second layer 504b is a doped silicon layer, including a p-type doped silicon layer or a n-type doped layer. In yet another example, the second layer 504b may be a group III-V material, such as a GaAs layer.

A hardmask layer 506 may be disposed on the multi-material layer 504. Suitable materials for the hardmask layer 506 may include silicon oxide, silicon nitride, silicon oxynitride, silicon carbide, silicon oxycarbide, amorphous carbon, titanium nitride, titanium oxide, titanium oxynitride, tantalum nitride, tantalum oxide, tantalum oxynitride, or any other suitable materials. Above the hardmask layer 506, a neutral layer 508 (or called a patterning defining layer) may be disposed thereon. The neutral layer 508 may be an anti-reflective coating (ARC) layer or other suitable layers to assist forming patterning features for a photoresist layer 514 to be formed thereon. Suitable exemplary materials of the neutral layer 508 may be similar to the materials utilized for the hardmask layer 506. The photoresist layer 514 as utilized here may be a layer of block copolymers (BCPs) including at least two types of polymers for segregation based on dissimilarities of the polymers included in the layer of block copolymers (BCPs). These changes may promote to the block copolymers (BCPs) to have a shift in phase orientation shift during a directed self-assembly (DSA) process subsequently performed. In one implementation, the layer of block copolymers (BCPs) may include two or more dissimilar polymeric block components. After the phase orientation shift process, a selected type of polymer may be removed from the substrate 203 in a development process, leaving another type of polymer thereon, forming a patterned photoresist layer 514, as shown in FIG. 5A. The patterned photoresist layer 514 has openings 512 formed therein, exposing a surface 506 of the neutral layer 508 for etching to transfer features into the multi-material layer 504. The opening 511 may have a width 510 less than 50 nm, such as less than 30 nm, such as between about 1 nm and about 10 nm.

In the implementation wherein the substrate 203 is a crystalline silicon layer, the first layer 504a may be a SiGe layer and the second layer 504b may be an intrinsic epi-silicon layer. In another implementation wherein the substrate 203 is a crystalline silicon layer, the first layer 504a may be a doped silicon containing layer and the second layer 504b may be an intrinsic epi-silicon layer. The doped silicon containing layer may be a p-type dopant or a n-type dopant as needed. In yet another implementation wherein the substrate 203 is a Ge substrate, the first layer 504a may be a GeSi layer and the second layer 504b may be an intrinsic epi-Ge layer. In still another implementation wherein the substrate 203 is a GaAs layer with dominantly a crystalline plane at <100>, the first layer 504a may be an intrinsic Ge layer and the second layer 504b is a GaAs layer. It is noted that the selection of the substrate materials along with the first layer 504a and the second layer 504 in the multi-material layer 504 may be in any combinations utilizing the materials listed above.

FIG. 5A' depicts a top view of the film stack 500 disposed on the substrate. The sectional view of FIG. 5A is taken along section line A'-A' shown in FIG. 5A'. In FIG. 5A', a source anchor 550 and a drain anchor 552 may be disposed laterally at two ends of the multi-material layer 504 so as to form nanowires between the source anchor 550 and the drain anchor 552 after series of processes are performed on the multi-material layer 504.

Referring additionally back to block 404, of FIG. 4, an etching process may be performed to form openings 516 in the multi-material layer 504, as shown in FIG. 5B. The etching process may be continuously performed to etch through the first layer 504a and the second layer 504b of the multi-material layer 504 to the substrate 203 until a desired depth or structure, such as the notch structure 520 depicted in FIG. 5B, is formed on or in the substrate 203. The openings 516 formed in the multi-material layer 504, along with the notch structure 520, if any, formed in the substrate 203, may later be utilized to form fin structures as required to form a FINFET device. The patterned multi-material layer 504 remaining on the substrate 203 may then be continually processed to form nanowire structures as needed on the substrate 203. After the etching process, the patterned photoresist layer 514, the neutral layer 508 and partial of the hardmask layer 506 may be consumed or removed from the substrate 203. In the example depicted in FIG. 5B and the top view of FIG. 5B', the patterned photoresist layer 514 and the neutral layer 508 are removed from the substrate 203, and the hardmask layer 506 may be partially removed, leaving some portion of the hardmask layer 506 on the substrate 203 as a etching mask layer for subsequent etching processes.

During the etching process, after the break through step of etching away the neutral layer 508 and the hardmask layer 506 exposed by the opening 512 defined in the patterned photoresist layer 514, a main etching process may be performed to mainly etch away the repeating first and/or second layers 504a, 504b of the multi-material layer 504. It is noted that since the materials of the neutral layer 508, the hardmask layer 506, and the first and the second layer 504a, 504b may be different, each layer may be etched in different chambers or the same chamber with different chemistries. In one embodiment, the neutral layer 508 and the hardmask layer 506 is etched in a first chamber, such as the processing chamber 200 depicted in FIG. 2, incorporated in the system 400, and the multi-material layer 504 is etched in a second chamber, such as the first processing chamber 100 depicted in FIG. 1, incorporated in the system 400, without breaking vacuum.

The main etching process is performed by supplying a main etching gas mixture including at least a halogen containing gas. Suitable examples of the halogen containing gas include $CHF_3$, $CH_2F_2$, $CF_4$, $C_2F$, $C_4F_6$, $C_3F_8$, HCl, $C_4F_8$, $Cl_2$, $CCl_4$, $CHCl_3$, $CHF_3$, $C_2F_6$, $CH_2Cl_2$, $CH_3Cl$, $SF_6$, $NF_3$, HBr, $Br_2$ and the like. While supplying the main etching gas mixture, an inert gas may also be supplied into the etching gas mixture to assist the profile control as needed. Examples of the inert gas supplied in the gas mixture include Ar, He, Ne, Kr, Xe or the like.

After the main etching gas mixture is supplied to the processing chamber mixture, a RF source power is supplied to form a plasma from the etching gas mixture therein. The RF source power may be supplied at the etching gas mixture between about 100 Watts and about 3000 Watts and at a frequency between about 400 kHz and about 13.56 MHz. A RF bias power may also be supplied as needed. The RF bias power may be supplied at between about 0 Watts and about 1500 Watts. In one implementation, the RF source power may be pulsed with a duty cycle between about 10 to about 95 percent at a RF frequency between about 500 Hz and about 10 MHz.

Several process parameters may also be controlled while supplying the etching gas mixture to perform the etching process. The pressure of the processing chamber may be controlled at between about 0.5 milliTorr and about 500 milliTorr, such as between about 2 milliTorr and about 100 milliTorr. A substrate temperature is maintained between about 15 degrees Celsius to about 300 degrees Celsius, such as greater than 50 degrees Celsius, for example between about 60 degrees Celsius and about 90 degrees Celsius etching process may be performed for between about 30 seconds and about 180 seconds until an underlying substrate surface 518 is exposed or the notch structure 520 is formed in the substrate 203.

At block 406, after the main etching process removes portion of the multi-material layer 504 away to form openings 516 in the multi-material layer 504, a lateral etching process is performed to selectively remove (partially or entirely) one type of material from the substrate 203. For example, the first layer 504a may be partially removed as depicted in FIG. 5C1, or the second layer 504b may be partially removed as shown in FIG. 5C2. In one example, the first layer 504a may be entirely removed from the substrate 203, as shown in a top view of the film stack 500 depicted in FIG. 5C', leaving spaces 555 between each second layers 504b, forming a suspended nanowire structure on the substrate 203 between the source anchor 550 and the drain anchor 552.

Based on different process requirements, different etching precursors are selected to selectively and specifically etch either the first layer 504a or the second layer 504b from the substrate 203. As the first and the second layers 504a, 504b remaining on the substrate 203 has substantially the same dimensions and only have sidewalls 540 exposed for etching, the etching precursors selected to have high selectivity between the first and the second layers 504a, 504b, and thus are be able to target and laterally etch only either the first layer 504a or the second layer 504b without attacking or damaging the other (i.e., non-target) layer. After a desired width of the targeted material is removed from the substrate 203, the lateral etching process may then be terminated.

In the example depicted in FIG. 5C1, the etching precursors are selected particularly to etch the first layer 504a without attacking or damaging the second layer 504b. In the example depicted in FIG. 5C2, the etching precursors are selected to particularly etch the second layer 504b without attacking or damaging the first layer 504a. In the implementations wherein only one type of material is desired to be remaining on the substrate 203, the lateral etching process may be continuously performed until the selected type of material is removed from the substrate, as shown in FIG. 5C', forming a suspended nanowire structure.

In one example wherein the first layer 504a is a SiGe layer and the second layer 504b is an intrinsic epi-Si layer formed on the silicon substrate 203, the etching precursor selected to etch the first layer 504a include at least a carbon fluorine containing gas supplied from a remote plasma source, such as the remote plasma source 143 depicted in FIG. 1. In this particular implementation, the substrate 203 may be transferred to a processing chamber with a remote plasma source, such as the processing chamber 100 depicted in FIG. 1. Suitable examples of the carbon fluorine containing gas may include $CF_4$, $C_4F_6$, $C_4F_8$, $C_2F_2$, $CF_4$, $C_2F_6$, $C_5F_8$, and the like. A reacting gas, such as $O_2$ or N2 may also be supplied with the carbon fluorine containing gas from the remote plasma source to promote the etching process. Further, a halogen containing gas may be supplied into the processing chamber to generate a plasma by a RF source power or a bias RF power or both, to further assist the etching process. Suitable halogen containing gas may be supplied into the processing chamber include HCl, $Cl_2$, $CCl_4$, $CHCl_3$, $CH_2Cl_2$, $CH_3Cl$ or the like. In one example, a $CF_4$ and $O_2$ gas mixture may be supplied from the remote plasma source while a $Cl_2$ gas may be supplied to the processing chamber to be dissociated by either a RF source power or a bias RF power or both in the processing region 141 defined in the processing chamber 100. The $CF_4$ and $O_2$ may have a flow rate ratio between about 100:1 and about 1:100.

During the lateral etching process, several process parameters may also be controlled while supplying the etching gas mixture to perform the etching process. The pressure of the processing chamber may be controlled at between about 0.5 milliTorr and about 3000 milliTorr, such as between about 2 milliTorr and about 500 milliTorr. A substrate temperature is maintained between about 15 degrees Celsius to about 300 degrees Celsius, such as greater than 50 degrees Celsius, for example between about 60 degrees Celsius and about 90 degrees Celsius. The RF source power may be supplied at the lateral etching gas mixture between about 50 Watts and about 3000 Watts and at a frequency between about 400 kHz and about 13.56 MHz. A RF bias power may also be supplied as needed. The RF bias power may be supplied at between about 0 Watts and about 1500 Watts.

While the process parameters may be controlled in a similar range, the chemical precursors selected to be supplied in the lateral etching mixture may be varied for different film layer etching request. For example, when the first layer 504a is a doped silicon layer and the second layer 504b is an intrinsic epi-Si layer formed on the silicon substrate 203, the etching precursor selected to etch the first layer 504a, e.g., the doped silicon layer, be a halogen containing gas supplied into the processing chamber include $Cl_2$, HCl, or the like. No chemical precursor is necessary to be supplied from the remote plasma source. The halogen containing gas, such as a $Cl_2$ gas, may be supplied to the processing chamber to be dissociated by either a RF source power or a bias RF power or both in the processing region 141 defined in the processing chamber 100.

In yet another implementation wherein the first layer 504a is a SiGe layer and the second layer 504b is an intrinsic epi-Si layer formed on the silicon substrate 203, the etching precursor selected to etch the second layer 504b, e.g., the intrinsic epi-Si layer, may be a carbon fluorine containing gas supplied from a remote plasma source, such as the remote plasma source 143 depicted in FIG. 1. Suitable examples of the carbon fluorine containing gas may include $CF_4$, $C_4F_6$, $C_4F_8$, $C_2F_2$, $CF_4$, $C_2F_6$, $C_5F_8$, and the like. A reacting gas, such as $O_2$ or $N_2$ may also be supplied with the carbon fluorine containing gas from the remote plasma source to promote the etching process. No gas may be supplied to the processing chamber to generate a plasma either by a RF source power or a bias RF power in the processing region 141. In one example, a $CF_4$, $N_2$ and $O_2$ gas mixture may be supplied from the remote plasma source in the processing chamber 100 for processing. The $CF_4$, $O_2$ and $N_2$ may have a flow rate ratio between about 100:1 and about 1:100.

In still another example wherein the first layer 504a is a SiGe layer and the second layer 504b is an intrinsic epi-Ge layer formed on the Ge substrate 203, the etching precursor selected to etch the first layer 504b, e.g., a SiGe layer, may include at least a carbon fluorine containing gas supplied from a remote plasma source, such as the remote plasma source 143 depicted in FIG. 1. A reacting gas, such as $O_2$ or $N_2$ may also be supplied with the carbon fluorine containing gas from the remote plasma source to promote the etching process. Further, a halogen containing gas may be supplied into the processing chamber to generate a plasma by a RF source power or a bias RF power or both, to further assist the etching process. Suitable halogen containing gas may be supplied into the processing chamber include $Cl_2$, HCl, or the like. In one example, a $CF_4$ and $O_2$ gas mixture may be supplied from the remote plasma source while a $Cl_2$ gas may be supplied to the processing chamber to be dissociated by either a RF source power or a bias RF power or both in the processing region 141 defined in the processing chamber 100. The $CF_4$ and $O_2$ may have a flow rate ratio between about 100:1 and about 1:100.

In yet another example wherein the first layer 504a is a Ge layer and the second layer 504b is a GaAs layer formed on the GaAs substrate 203, the etching precursor selected to etch the first layer 504a, e.g., a Ge layer, may include at least a carbon fluorine containing gas supplied from a remote plasma source, such as the remote plasma source 143 depicted in FIG. 1. A reacting gas, such as $H_2$, $N_2$ or Ar, may also be supplied with the halogen containing gas from the remote plasma source to promote the etching process. Suitable halogen containing gas may be supplied into the processing chamber include $Cl_2$, HCl, HBr or the like. Further, a carbon fluorine containing gas may be supplied into the processing chamber to generate a plasma by a RF source power or a bias RF power or both, to further assist the etching process. In one example, a $Cl_2$ and $H_2$ gas mixture may be supplied from the remote plasma source while a $CF_4$ gas may be supplied to the processing chamber to be dissociated by either a RF source power or a bias RF power or both in the processing region 141 defined in the processing chamber 100. The $Cl_2$ and $H_2$ may have a flow rate ratio between about 100:1 and about 1:100.

FIG. 6 is a flow diagram of a method 600 for manufacturing a nanowire structure with a first starting material converting to a second resultant material. FIGS. 7A-7E are schematic top view of a portion of suspended nanowire structure 700 corresponding to various stages of the method 600. The suspended nanowire structure 700 may be utilized to form a fin field effect transistor (FinFET) for three dimensional (3D) stacking of semiconductor chips. Alternatively, the method 600 may be beneficially utilized to etch other types of structures. It is noted that the suspended structure 700 as utilized here depicted in FIG. 7A-7E may be manufactured by the method 400 described above using the method 400 depicted in FIG. 4 with corresponding structures depicted in FIG. 5A'-5C'.

The method 600 begins at block 602 by providing a substrate, such as the substrate 203 described above, with suspended nanowire structures 700 formed thereon between the source anchor 550 and the drain anchor 552. The nanowire structure may have originally have a multi-material layer 504 including a first layer 702a having a first material. A second layer (not shown in FIG. 7A-7E) may be originally formed in between each first layer 702a but later removed by an etching process, leaving a space 704 in between each first layer 702a so as to form the suspended nanowire structures 700. In one example, the first layer 702a is an intrinsic epi-silicon layer. It is noted that the first layer 702a may be any material that may be later converted to a different material as needed.

At block 604, an optional $H_2$ annealing process may be performed to utilize $H_2$ gas to treat the suspended nanowire structures 700. It is noted that the $H_2$ annealing process may be performed to assist removing or driving out the impurities in the nanowire structure so as to result in a more robust structure.

At block 606, an ion implantation process may be performed to implant desired dopants into the suspended nanowire structures 700. The ion implantation process as performed here may be a conventional or other suitable ion implantation process, for example that utilizes an ion beam/ion gun to provide ion sources into the suspended nanowire structures 700. Alternatively, the ion implantation process as performed here may be a plasma treatment process, particularly a directional plasma process to dope dopants into the nanowire structures 700. The ion implantation process is performed by implanting ions 704, with or without desired incident angles, to a selected region of the first layer 702a of the suspended nanowire structures 700. The ions, which include a desired type of atoms, is doped into the suspended nanowire structures 700. The implanted dopants later form and remain as dominant atoms in the first layer 702a in the suspended nanowire structures 700, as further described below.

In one example, the ion implantation process may be performed for a period of time between about 1 seconds and about 180 seconds so as to dope dopants into the suspended nanowire structures 700 with a doping concentration of between about $1E15$ ions/cm$^2$ and about $1E22$ ions/cm$^2$.

In one embodiment, an ion doping gas mixture may be supplied during the ion implantation process to provide dopants to be doped into the first layer 702a in the suspended nanowire structures 700. Suitable gases for supplying in the ion doping gas mixture include $AsH_3$, $GaH_3$, $SiH_4$, $SiF_4$, $GeH_4$, $GeF_4$, $CH_4$, $CF_4$, $AsF_5$, $PF_3$, $PF_5$, $B_2H_6$, $BH_3$ and the like. Inert gas, such as Ar, He, Kr, Ne or the like, or carrier gases, such as $H_2$, $N_2$, $N_2O$, $NO_2$, or the like, may also be supplied into the ion doping gas mixture.

In one embodiment, the doping gas mixture may include at least one or more of a Ge containing gas, Ga containing gas, As containing gas, P containing gas, B containing gas or In containing gas, so that the desired type of atoms to be doped includes at least one or more of Ge, Ga, As, P or In atoms. In one example, the doping gas supplied to the doping gas mixture is a Ge containing gas. The Ge dopants may be doped into the first layer 702a through its sidewall surrounding the atoms, such as silicon atoms in this example, which predominantly form the first layer 702a in the suspended nanowire structures 700. For example, in the implementation wherein the doping gas is a Ge containing gas and the first layer 702a is made from a silicon material, the doped atoms are Ge atoms and the original atoms 502 which predominantly form the first layer 702a is Si atoms. The Ge atoms are primary located on the sidewall of the first layer 702a while the silicon atoms are still the main components predominantly comprising the first layer 702a (e.g., at a center region of the first layer 702a).

Figures 7A, 7B, 7C, 7D, 7E:
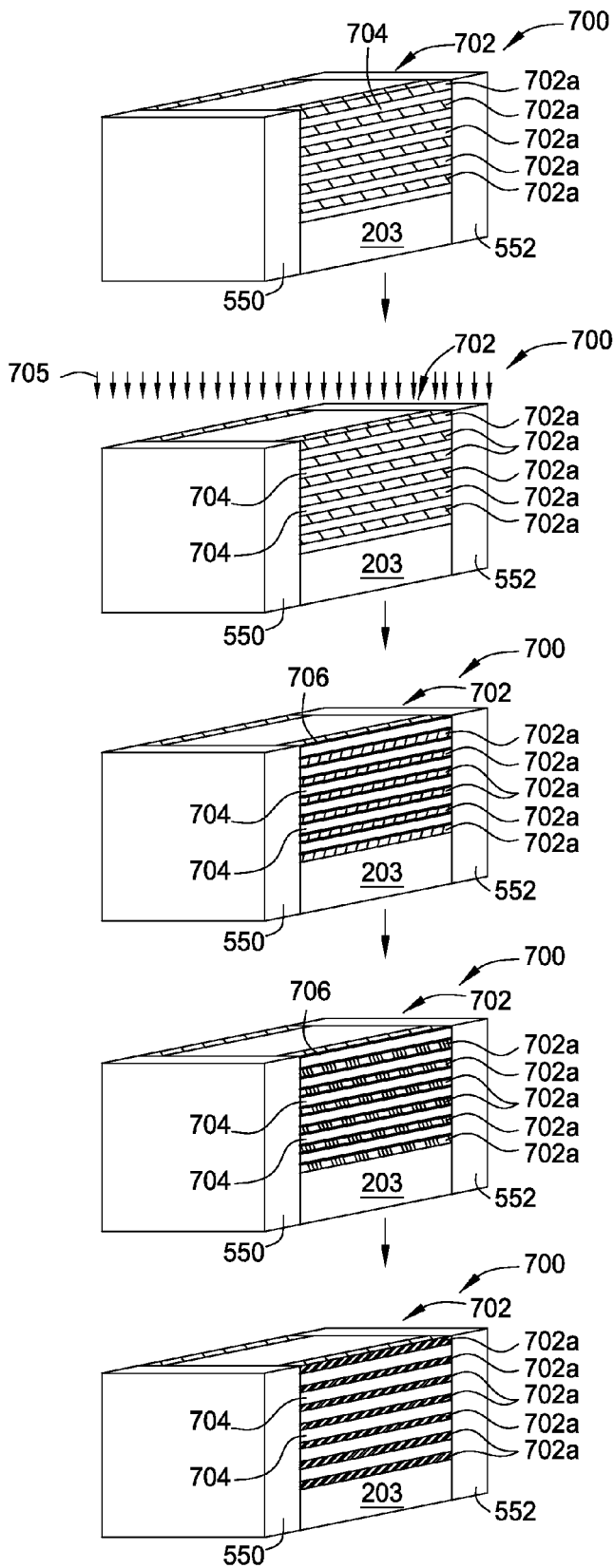

At block 608, an oxidation process performed to form an oxidation layer 706 on the sidewalls of the first layer 702a, as shown in FIG. 7C. Alternatively, a nitridation process may also be utilized to form a nitridation layer on the first layer 702a, instead of an oxidation layer. The oxidation process consumes the silicon atoms from the first layer 702a and helps to push the Ge atoms toward the center region of the first layer 702a. Oxygen atoms from the oxidation layer 706 pulls the silicon atoms upward/downward or outward from the first layer 702a to react with the silicon atoms, while driving the Ge atoms inward to the center of the first layer 702a away from the sidewall.

At block 610, by doing so, the silicon atoms in the first layer 702a of the suspended nanowire structures 700 may be gradually pulled out of the center of the structure 700 and react with the oxygen atoms to form the oxidation layer 706 on the sidewalls, leaving the Ge atoms in the center of the first layer 702a to replace the atomic sites previously occupied by the silicon atoms. As such, the silicon atoms may gradually converted, replaced and driven out by the Ge atoms, thus leaving the first layer 702a predominantly comprised of Ge atoms.

In one implementation, the oxidation process may be performed in a suitable plasma processing chamber, including the processing chambers, including the etching processing 100, 200 depicted in FIGS. 1-2 or any other suitable plasma chamber, including deposition processing chambers or plasma ion implantation processing chambers. The processing temperature is controlled at a low temperature range, such as less than 950 degrees Celsius. It is believed that the low temperature process may provide gentle thermal energy to consume the silicon atoms and pushing laterally/upward/downward or outward toward the sidewalls where the oxygen atoms are present so as to form the silicon oxide 706 without damaging the lattice structures as formed from the Ge atoms left in the suspended nanowire structures 700. By doing so, the silicon atoms may be gradually and conformally replaced with the Ge atoms without creating interfacial sites or atomic vacancies. In one implementation, the process temperature may be performed between about 25 degrees Celsius and about 650 degrees Celsius.

In one implementation, the oxidation process may be performed in a plasma containing environment. The oxidation process may be performed by using a treatment gas mixture to form a plasma in a processing environment to plasma treat the first layer 702a. In one implementation, the treatment gas mixture includes at least one of an oxygen containing gas with or without an inert gas. Suitable examples of the oxygen containing gas include $O_2$, $O_3$, $H_2O$, $NO_2$, $N_2O$ and the like. Suitable examples of the inert gas supplied with the treatment gas mixture include at least one of Ar, He, Kr, and the like. In an exemplary embodiment, the oxygen containing gas supplied in the treatment gas mixture is $O_2$ gas with a flow rate between about 50 sccm and about 1000 sccm.

During the oxidation process, several process parameters may be regulated to control the oxidation process. In one exemplary implementation, a process pressure is regulated between about 2 mTorr to about 500 mTorr. A RF bias power may be applied to maintain a plasma in the treatment gas mixture. For example, a RF bias power of about 10 Watts to about 500 Watts may be applied to maintain a plasma inside the processing chamber. A RF source power at a frequency may be applied to maintain a plasma in the treatment gas mixture. A substrate temperature is maintained between about 25 degrees Celsius to about 950 degrees Celsius, such as between about 50 degrees Celsius and about 300 degrees Celsius.

It is noted that that temperature of oxidation process may be adjusted and varied (i.e., multiple step process) during the conversion process. For example, the temperature of oxidation process may be reduced when the first layer 702a gradually becomes richer in Ge atoms so as to prevent the Ge rich first layer 702a from melting or otherwise becoming damaged.

In one implementation, the oxidation process is completed when the silicon atoms in the first layer 702a have mostly or entirely been pulled outward to react with the oxygen atoms, converting the first layer 702a to include predominantly Ge atoms as shown in FIG. 7D. It is noted that FIG. 7D depicts the first layer 702a with Ge atoms after the conversion process. In some embodiment, the silicon atoms may only be partially removed so as to keep balanced amount of Si atoms and Ge atoms to form a SiGe composite material as needed.

At block 612, the oxidation layer 706 is removed from the first layer 702a in the suspended nanowire structures 700, as shown in FIG. 7E. The overall process time of the oxidation process may be determined by time mode after the silicon atoms are predominantly replaced with or converted to Ge atoms. In one example, the substrate 203 is subjected to the oxidation process for between about 5 seconds to about 5 minutes, depending on the oxidation rate of the first layer 702a, pressure and flow rate of the gas. In an exemplary implementation, the substrate 203 is exposed to the oxidation processes for about 600 seconds or less. The oxidation layer 706 may be removed by dry etching process or wet etching process as needed.

FIG. 8 is a flow diagram of a method 800 for manufacturing a nanowire structure with a portion of the nanowire having a different material than the first starting material. FIGS. 9A-9D are schematic top view of a portion of suspended nanowire structure 900 corresponding to various stages of the method 800. The suspended nanowire structure 900 may be utilized to form a fin field effect transistor (FinFET) for three dimensional (3D) stacking of semiconductor chips. Alternatively, the method 800 may be beneficially utilized to form other types of structures. It is noted that the suspended structure 900 as utilized here depicted in FIGS. 9A-9D may be manufactured by the method 400 described above using the method 400 depicted in FIG. 4 with corresponding structures depicted in FIG. 5A'-5C'.

Figures 9A, 9B, 9C, 9D:
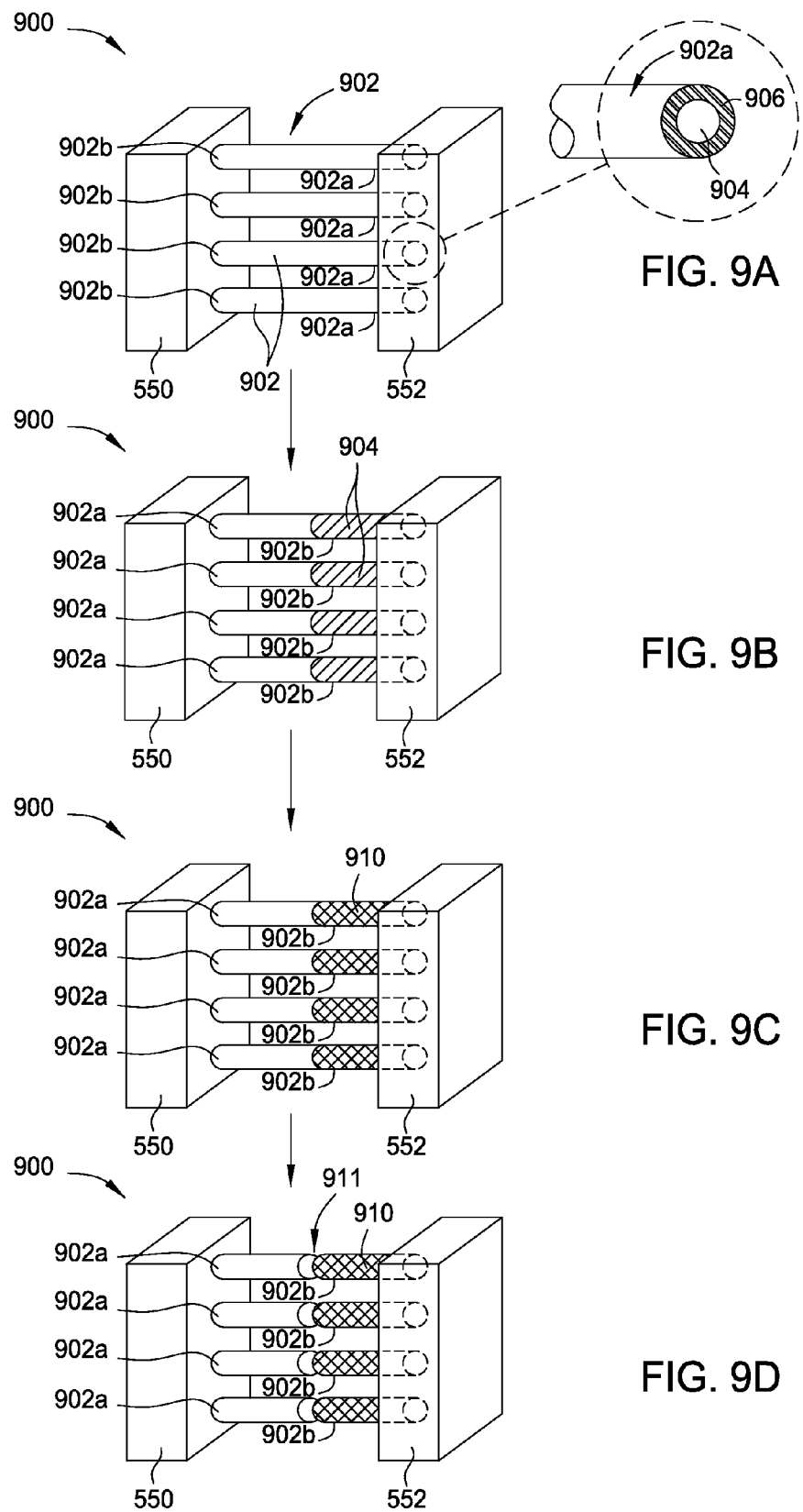

The method 800 begins at block 802 by providing a substrate, such as the substrate 203 described above, with suspended nanowire structures 900 formed thereon between the source anchor 550 and the drain anchor 552. The nanowire structure may have originally a multi-material layer 902 including a first layer 902a comprising a first material. A second layer (not shown in FIG. 9A-9D) may be originally formed in between each first layer 902a but later removed by an etching process, leaving spaces in between each first layer 902a so as to form the suspended nanowire structures 900. In one example, the first layer 902a is an intrinsic epi-Ge layer, as shown in FIG. 9A. In the enlarged view of a portion of the first layer 902a, the first layer 902a includes a main body 904 fabricated by the epi-Ge layer as discussed above. A coating layer 906 may be coated on an outer surface of the main body 904 of the first layer 902a. In one example, the coating layer 906 may be fabricated from a high-k material, a material that has a dielectric constant greater than 5. Suitable examples of the high-k material includes hafnium dioxide (HfO2), zirconium dioxide (ZrO2), hafnium silicate oxide (HfSiO4), hafnium aluminum oxide (HfAlO), zirconium silicate oxide (ZrSiO4), tantalum dioxide (TaO2), aluminum oxide, aluminum doped hafnium dioxide, bismuth strontium titanium (BST), or platinum zirconium titanium (PZT), among others. In one particular implementation the coating layer is a hafnium dioxide (HfO2) layer. It is noted that the first layer 902a may be any material that may be later having a portion being converted to a different material as needed.

At block 804, a lateral etch process is performed to remove a portion 902b of the coating layer 906 from the first layer 902a, exposing the underlying main body 904 of the first layer 902a, as shown in FIG. 9B. After the underlying main body 904 is exposed, the etching process may be further performed to remove a portion of the main body 904 so as to provide a space for a second material to be grown thereon, which will be described below at block 806. In one implementation, the lateral etching process is performed to specifically only remove a pre-determined area, the portion 902b from the first layer 902a covering substantially from a center to an end of the first layer 902a in the suspended nanowire structures 900. It is noted that the area, width, and dimension of the portion 902b to have the coating layer 906 removed may be in any size or coverage as needed.

In one example, the lateral etching process may be performed by supplying a gas mixture including at least a carbon fluorine containing gas supplied from a remote plasma source, such as the remote plasma source 143 depicted in FIG. 1. In this particular example, the substrate 203 may be transferred to a processing chamber with a remote plasma source, such as the processing chamber 100 depicted in FIG. 1. Suitable examples of the carbon fluorine containing gas may include $CF_4$, $C_4F_6$, $C_4F_8$, $C_2F_2$, $CF_4$, $C_2F_6$, $C_5F_8$, and the like. A reacting gas, such as $O_2$, $H_2$ or $N_2$ may also be supplied with the carbon fluorine containing gas from the remote plasma source to promote the etching process. Further, a halogen containing gas may be supplied into the processing chamber to generate a plasma by a RF source power or a bias RF power or both, to further assist the etching process. Suitable halogen containing gas may be supplied into the processing chamber include $Cl_2$, HCl, or the like. In one example, a $CF_4$ and $O_2$ gas mixture may be supplied from the remote plasma source while a $Cl_2$ gas may be supplied to the processing chamber to be dissociated by either a RF source power or a bias RF power or both in the processing region 141 defined in the processing chamber 100. The $CF_4$ and $O_2$ may have a flow rate ratio between about 100:1 and about 1:100.

At block 806, a selective deposition process is performed to grow a second material layer selectively on the exposed main body 904 of the portion 902b of the first layer 902a. Different materials comprising the first and second layers may have different adhesions and absorbability on different surfaces, i.e., a first material adhered on a particular surface comprised of a first type of material disposed on a substrate may not be successfully adhered on another surface with a second type of material disposed on the same substrate. As such, by utilizing the first layer 902a having two different types of materials exposed during deposition, the material layer can be only selectively formed on a particular surface with similar lattice constant to the material layer to be formed thereon. In one example, a GaAs layer 910 may be formed on the exposed main body 904 of the first layer 902a, as shown in FIG. 9C.

Since the Ge material from the exposed main body 904 of the first layer 902a may have a similar lattice constant to the GaAs layer 910, the GaAs layer 910 may be easily grown on and absorbed on the Ge surface of the main body 904 of the first layer 902a. In contrast, the coating layer 906, such as a high-k material, generally has a lattice constant far away from the GaAs layer 910. As such, chances for the GaAs layer to be suitable adhered onto the coating layer 906 for growth is very slim. By utilizing their natural material property difference, a selective deposition/growth of the GaAs layer 910 may be enabled to predominately form on the surface of the exposed main body 904 of the first layer 902a.

In one embodiment, the second material layer may be formed using one or more suitable conventional deposition techniques, such as atomic layer deposition (ALD), epitaxial deposition process, physical vapor deposition (PVD), chemical vapor deposition (CVD), plasma enhanced CVD (PECVD), SACVD, furnace deposition, and the like.

At block 808, after the GaAs layer 910 is formed on the portion 902b of the first layer 902a, an additional etching process may be performed to separate the portion 902b with the growth of the GaAs layer 910 from the original first layer 902a, as shown in FIG. 9D. The etching process may etch at an interface 911 defined between the original unchanged first layer 902a and the selected portion 902b with GaAs layer 910 grown thereon, cleaving the nanowire structures 900 at the interface 911, thus breaking the nanowire structures 900 into two sub-nanowires. It is noted that other suitable techniques that may breaking the nanowire structures 900 at the interface 911 may also be utilized, including mechanical punching, cutting, drilling, cleaving, or wet dissolution the like.

In the embodiment wherein an etching process is performed to break the interface 911, the etching process may be performed to utilize a remote plasma source formed from a gas mixture including carbon fluorine gases, halogen containing gas or hydrocarbon containing gas or one of a $N_2$, $O_2$ or $H_2$ gas.

Thus, methods for forming nanowire structures with desired materials for three dimensional (3D) stacking of fin field effect transistor (FinFET) for semiconductor chips are provided. The methods utilize lateral etching process to selective remove a certain type of material from a multi-material layer so as to form a suspended nanowire structures that may be later utilized to form fin field effect transistor (FinFET). Furthermore, the remaining material in the suspended nanowire structures may further be converted to another material utilizing a conversion process. In addition, a portion of the nanowires included the suspended nanowire structures may be partially converted to another material different from the original material utilized to form the nanowire structures. This material alternation in the nanowire structures may be obtained by performing a selective deposition process to selectively form a different material on a portion of the nanowire structures. Thus, a fin structure with desired type of material formed in the fin structure may be obtained, particularly for applications in three dimensional (3D) stacking of semiconductor fin field effect transistors (FinFET).

While the foregoing is directed to embodiments of the present invention, other and further embodiments of the invention may be devised without departing from the basic scope thereof, and the scope thereof is determined by the claims that follow.

The invention claimed is:

1. A method of forming nanowire structures on a substrate comprising:
    etching a multi-material layer on a substrate, wherein the multi-material layer includes repeating pairs of a first layer and a second layer, the substrate further comprising a patterned hardmask layer disposed on the multi-material layer, wherein etching the multi-material layer exposes sidewalls of the first and the second layer of the multi-material layer through openings defined by the patterned hardmask layer, the multi-material layer having a first end coupled to a first side surface of a source anchor and a second end coupled to a second side surface of a drain anchor, the first and the second side surfaces of the source and the drain anchors longitudinally formed along two sides of the substrate respectively and circumscribing the substrate from the two sides; and
    laterally and selectively etching the second layer from the substrate.

2. The method of claim 1, wherein laterally and selectively etching the second layer further comprises:
    reducing a lateral dimension of the second layer remaining on the substrate.

3. The method of claim 1, wherein laterally and selectively etching the second layer further comprises:
    supplying an etching mixture into a processing chamber where the substrate is disposed for etching, wherein the etching gas mixture includes at least a carbon fluorine containing gas supplied from a remote plasma source.

4. The method of claim 3, wherein the carbon fluorine containing gas is selected from a group consisting of $CF_4$, $C_4F_6$, $C_4F_8$, $C_2F_2$, $CF_4$, $C_2F_6$ or $C_5F_8$.

5. The method of claim 3, wherein the etching gas mixture further comprises a reacting gas, the reacting gas comprising at least one of $O_2$, $N_2$, or $H_2$.

6. The method of claim 3, wherein supplying the etching gas mixture further comprises:
generating a plasma in the processing chamber from a gas mixture including a halogen containing gas.

7. The method of claim 6, wherein the halogen containing gas is selected from at least one of HCl, $Cl_2$, $CCl_4$, $CHCl_3$, $CH_2Cl_2$ and $CH_3Cl$.

8. The method of claim 1, wherein the first layer of the multi-material layer is an intrinsic silicon layer and the second layer of the multi-material layer is a SiGe layer while the substrate is a silicon substrate.

9. The method of claim 1, wherein the first layer of the multi-material layer is an intrinsic silicon layer and the second layer of the multi-material layer is a doped silicon layer while the substrate is a silicon substrate.

10. The method of claim 1, wherein the first layer of the multi-material layer is an intrinsic Ge layer and the second layer of the multi-material layer is a GeSi layer while the substrate is a Ge substrate.

11. The method of claim 1, wherein the first layer of the multi-material layer is a GaAs layer and the second layer of the multi-material layer is a Ge layer while the substrate is a GaAs substrate.

12. The method of claim 1, wherein etching the multi-material layer further comprising:
etching the multi-material layer through the openings defined by the hardmask layer until a portion of the substrate circumscribed between the source and drain anchors is removed and exposed by the openings defined in the multi-material layer.

13. The method of claim 12, wherein the openings defined in the multi-material layer are utilized to form fin structures for fin field effect transistors (FinFET).

14. The method of claim 1, wherein etching of the multi-material layer is performed in a first processing chamber and etching of the lateral etching of the second layer in the multi-material layer is performed in a second processing chamber without breaking vacuum.

15. The method of claim 14, wherein the first processing chamber and the second processing chamber are both incorporated in a processing system.

16. The method of claim 1, wherein laterally and selectively etching the second layer further comprises:
entirely removing the second layer from the substrate, leaving spaces between each first layer formed in the multi-material layer.

17. The method of claim 1, wherein the multi-material layer includes at least 4 repeating pairs of the first layer and the second layer.

18. A method of forming nanowire structures on a substrate comprising:
etching a substrate having a multi-material layer disposed thereon in a first processing chamber, wherein the multi-material layer includes repeating pairs of a first layer and a second layer formed on the substrate, and wherein a portion of the multi-material layer is exposed by openings defined by a patterned hardmask layer for etching until sidewalls of the first and the second layer of the multi-material layer are exposed, the multi-material layer having a first end coupled to a first side surface of a source anchor and a second end coupled to a second side surface of a drain anchor, the first and the second side surfaces of the source and the drain anchors longitudinally formed along two sides of the substrate respectively and circumscribing the substrate from the two sides; and
laterally and selectively etching the second layer from the substrate in a second processing chamber without breaking vacuum, wherein the first and the second processing chamber are incorporated in a single vacuum processing system.

19. The method of claim 18, wherein laterally and selectively etching the second layer further comprises:
using a remote plasma source including a hydrocarbon containing gas and at least one of $N_2$, $O_2$, or $H_2$ gas to laterally etch the second layer.

20. A method of forming nanowire structures on a substrate comprising:
etching a substrate having a multi-material layer disposed thereon, wherein the multi-material layer includes repeating pairs of a first layer and a second layer, and wherein a portion of the multi-material layer is exposed by openings defined by a patterned hardmask layer for etching until sidewalls of the first and the second layer of the multi-material layer are exposed, the multi-material layer having a first end coupled to a first side surface of a source anchor and a second end coupled to a second side surface of a drain anchor, the first and the second side surfaces of the source and the drain anchors longitudinally formed along two sides of the substrate respectively and circumscribing the substrate from the two sides; and
laterally and selectively etching the second layer from the substrate by a remote plasma source including a hydrocarbon containing gas and at least one of $N_2$, $O_2$, or $H_2$ gas.

* * * * *